United States Patent [19]

Jaffe et al.

[11] Patent Number: 4,487,574
[45] Date of Patent: Dec. 11, 1984

[54] SWITCHING DEVICE FOR PHOTOFLASH UNIT

[75] Inventors: Mary S. Jaffe, Cleveland Heights, Ohio; Vaughn C. Sterling, Mattoon, Ill.

[73] Assignee: General Electric Company, Schenectady, N.Y.

[21] Appl. No.: 451,505

[22] Filed: Dec. 20, 1982

[51] Int. Cl.³ .............................................. F21K 5/02
[52] U.S. Cl. ................... 431/359; 252/501.1; 252/512; 252/514; 338/15; 338/215; 362/6; 362/15
[58] Field of Search ................... 431/359, 362; 337/30, 337/401, 413, 416; 338/15; 252/501.1, 512, 514; 362/4, 5, 11, 13, 15

[56] References Cited

U.S. PATENT DOCUMENTS

| | | | |
|---|---|---|---|
| Re. 30,274 | 5/1980 | Bolon et al. | 361/411 |
| 3,506,385 | 4/1970 | Weber et al. | 431/362 |
| 3,551,246 | 12/1970 | Bassemir et al. | 204/159.15 X |
| 3,573,230 | 3/1971 | Van Voorhees | 252/514 |
| 3,990,833 | 11/1976 | Holub et al. | 431/359 |
| 4,064,431 | 12/1977 | Coté | 362/4 |
| 4,182,608 | 1/1980 | Chevali et al. | 431/359 |
| 4,324,543 | 4/1982 | Broadt | 431/359 |
| 4,336,570 | 6/1982 | Brower et al. | 362/4 |
| 4,388,606 | 6/1983 | Shaffer et al. | 338/15 |
| 4,427,369 | 1/1984 | Brower | 431/359 |

Primary Examiner—Carroll B. Dority, Jr.
Assistant Examiner—Allen J. Flanigan
Attorney, Agent, or Firm—John F. McDevitt; Philip L. Schlamp; Fred Jacob

[57] ABSTRACT

A multiple flashlamp array is disclosed having a plurality of lamps fired individually and in sequence by means of a plurality of static solid switching devices capable of reliable actuation by radiant energy generated during flashing of the lamps. Initially, these switching devices have a high electrical resistance ("off position") and after being actuated by the heat and light radiation, they undergo chemical conversion to an electrically conductive state ("on position"). The switch devices are prepared in a conventional manner from a particulate mixture of silver oxide with a metal exhibiting both thermal and electrical conductivity but which does not react exothermally with said silver oxide. A binder mixture is used which includes a conventional organic polymer binder which serves as a fuel during conversion of the silver oxide together with a second organic polymer binder which is more resistant to combustion. The addition of the combustion resistant polymer binder reduces the tendency of the switch material to "blow off" the switch terminals during conversion. The low voltage flashlamps being fired in this manner require that the converted switch devices exhibit an electrical resistance after conversion not to exceed about 0.3 ohms.

7 Claims, 3 Drawing Figures

SWITCHING DEVICE FOR PHOTOFLASH UNIT

BACKGROUND OF THE INVENTION

Flashlamp units employing solid state switching devices to fire a plurality of flashlamps individually and in sequence are well-known. In U.S. Pat. No. 3,458,270 there is disclosed such a switching arrangement having switch devices of silver oxide adhesively bonded to the substrate of an electrical circuit with an organic polymer binder. The particular flashlamps employed are further depicted to be of the low voltage type which upon battery ignition convert the switch devices in the electrical circuit to a "low ohmic" condition. The organic binder in the switch material composition is said to produce a chain of reduction and oxidation reactions with the silver oxide which occurs simultaneously and exothermally in converting to a metallic silver state.

The conversion of silver oxide to metallic silver as a switching device in a photoflash unit is also well-known for use in the same manner with high voltage type flashlamps. For example, in a more recently issued U.S. Pat. No. 3,990,833, assigned to the assignee of the present invention, there is disclosed a switch material composition having silver oxide mixed with carbon containing silver salt and a humidity resistant organic polymer binder which is converted by the radiant energy provided when a joining flashlamp is fired to metallic silver having a relatively low electrical resistance. The use of silver oxide as the sole silver source in the switching material composition is objectionable as being overly sensitive and proves to react too vigorously during conversion. That is, the silver oxide converts too vigorously and damages the circuitboard or the electrical circuit. Since the continuity of the electrical circuit to the next unfired flashlamp is also likely to be destroyed by such action, a carbon containing silver salt is mixed in the switch material composition to reduce this overall problem. In so doing, the electrical resistance of the converted switch is said to be in the range 0.1–10 ohms.

A need still remains for these switches to exhibit higher electrical conductivity when converted and which is not subject to a violent reaction in photoflash units employing low voltage type flashlamps. Any modification of the switch material composition to accomplish these results must further remain stable under conditions of elevated temperature and high humidity by reason of experiencing such conditions during storage and use.

SUMMARY OF THE INVENTION

It is, therefore, an important object of the present invention to provide an improved photoflash unit using this type switching arrangement which is both converted more reliably as well as remaining stable under conditions of high temperature and high humidity. It has been discovered that a switch material composition having silver oxide may further be mixed with a powdered metal exhibiting both thermal and electrical conductivity but which does not react exothermally with silver oxide and which further includes a high relative humidity resistant organic polymer binder undergoes the desired thermochemical change when operated in this type lamp firing circuitry with low voltage flashlamps. More particularly, the presently improved photoflash lamp unit comprises a pair of low voltage type flashlamps, an electrical circuit into which said lamps are arranged to fire individually and in sequence, and a solid state radiant energy switching device located external of the lamps and forming part of the electrical circuit, said switching device being located adjacent to one of said lamps and disposed to receive radiant energy emitted by that lamp, said photoflash unit being characterized by said flashlamps being actuated by a low voltage firing pulse and by said switching device comprising a particular mixture of silver oxide with a metal exhibiting thermal and electrical conductivity which does not react exothermally with said silver oxide and further including a high relative humidity resistant organic polymer binder. A particulate metal component in said switch material composition provides a heat sink for the silver oxide during conversion, and also conducts heat to the circuitboard conductors that are connected to the switch device while still further increasing the electrical conductivity in the converted switch. Suitable metals providing this desired coaction in powdered form include silver, copper, aluminum, and zinc while other metals such as tin and titanium are unsuitable by reason of reacting exothermally with silver oxide during the thermochemical conversion sufficient to produce "blow-off" of the switching device when undergoing change to the on condition. Copper is the preferred metal additive since zinc and aluminum are prone to corrosion in moisture environments whereas silver is not only more costly but produces too low electrical resistance in the switching device in the off condition.

The humidity resistant organic polymer binder component in the switch material composition provides a medium to hold the mixture together as well as to adhesively bond the switching device to the substrate supporting the associated electrical firing circuit. More particularly, the preferred switching device comprises a mass of the switch material composition which extends between and contacts a pair of terminals in said electrical circuit while being adhesively bonded generally to a circuitboard member physically supporting the electrical conductors that form the electrical circuit. Useful organic polymer binders serving this purpose include the cellulose esters, such as cellulose nitrate; the cellulose ethers, such as ethyl cellulose and ethyl hydroxyethyl cellulose; acrylates such as polyalkylacrylate, polyalkylmethacrylate, polymethylmethacrylate, polymethylacrylate; polycarbonate; and polystyrene. In a preferred switch material composition, the organic binder is present in sufficient amounts to undergo combustion with at least part of the oxygen being required for said combustion being obtained by chemical reduction of the silver oxide component. From 3–6 weight percent of the organic binder in the switch material composition satisfies this objective although approximately 8–13 weight percent organic binder in the switch material composition is generally employed for continued adhesion of the converted switch to a number of circuitboard materials including copper-glass epoxy, copper phenolic, or silver-porcelainized steel. For example, adequate adhesion of the converted switch device to a copper-glass epoxy circuitboard can be maintained with a binder mixture having one organic polymer binder serving as the fuel along with a second organic polymer binder, such as a commercially available black phenolic resin, which is apparently more resistant to combustion when the thermochemical reaction takes place.

A suitable radiant energy responsive switch material composition satisfying all of the foregoing objectives comprises in weight percent approximately 51-72% silver oxide, approximately 20-36% powdered metal exhibiting thermal and electrical conductivity which does not react exothermally with silver oxide and approximately 8-13% organic polymer binder. Up to about 2% by weight of a conversion inhibitor for the silver oxide such as benzotriazole or a commercial waterproofing agent such as Reomet #38 is also added optionally to the switch material composition for improved humidity resistance after the switching devices have been deposited on the circuitboard. In applying switches to the circuitboard between the electrical terminals, conventional coating techniques may be used which require the presence of an organic diluent or solvent. Useful solvents include pine oil, hydrocarbon fluids, esters, e.g. butylacetate, etc., which are conventionally used in silk screening. The material for deposition is formed by mixing the switch material components together with the solvent to form a slurry. This may be applied across the terminals for each switch by conventional means such as a thin coating preferably by silk screening techniques.

DESCRIPTION OF THE PREFERRED EMBODIMENTS

Figure 1:
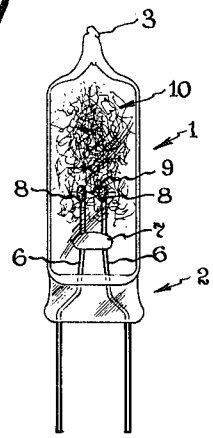
FIG. 1 is an elevation view of a prior art photoflash lamp of the all-glass type which can be used in a photoflash unit according to the present invention.

Referring now to FIG. 1, there is shown a representative all-glass type flashlamp of the prior art such as more fully disclosed in U.S. Pat. Nos. 2,982,119; 3,188,162; or 3,304,750, all assigned to the assignee of the present invention. The lamp comprises a tubular glass wall indicated at 1 with said wall forming part of the hermetically sealed envelope enclosing the operating parts of the lamp. The stem press base, indicated at 2, seals one end of the lamp and provides electrical contact means and handling means while an exhaust tip 3 has been provided and closed at the other end of the lamp. The inlead wires 6 pass through the stem press base 2 and are preferably joined by a glass bead 7 within the lamp envelope which holds them rigidly. The inner ends of the inleads are coated with a photoflash primer 8 and have an electrical filament 9 connecting them to provide the ignition means for said lamp. A filling of filamentary combustible material 10 is provided within the lamp envelope along with a combustion supporting atmosphere, such as oxygen, at above atmospheric pressure to provide the source of lamp illumination when actuated with an electrical firing pulse, from a low voltage firing circuit, of about 4 volts intensity.

Figure 2:
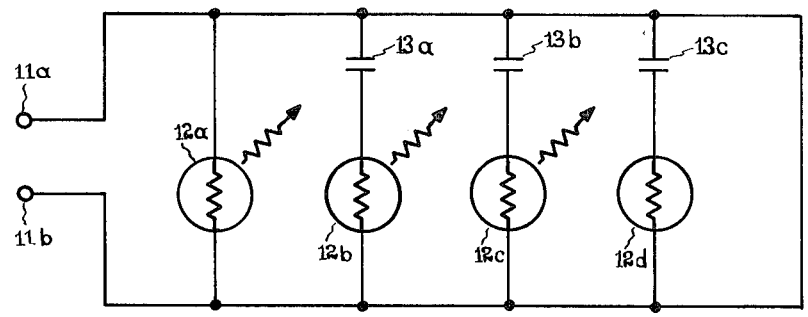
FIG. 2 is an electrical schematic diagram of a preferred firing circuit embodying improved switching devices of the present invention.

In FIG. 2, a plurality of said electrically fired photoflash lamps 12a, 12b, 12c and 12d are provided in a flashlamp unit which is provided with a pair of electrical terminals 11a and 11b for connection respectively to a conventional source of low voltage such as a battery (not shown). The circuit terminal 11b is connected electrically to a lead-in wire of each of the flashlamps 12a through 12b. The circuit terminal 11a is connected electrically to the other lead-in wire of lamp 12a. Normally open radiation switches 13a, 13b and 13c are respectively connected in electrical series between the other lead-in wires of lamps 12b, 12c and 12d and the circuit terminal 11a, and are respectively positioned sufficiently near the lamps 12a, 12b and 12c to receive sufficient light and/or heat radiation therefrom when flashed so as to become converted to the low resistance or on condition thereby connecting the array terminal 11a to the next lamp to be flashed. The lamps are open circuits or have a high impedance across their lead-in wires after flashing.

Figure 3:
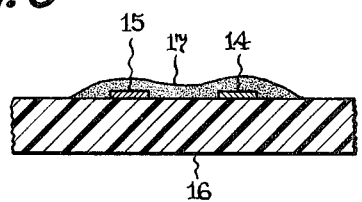
FIG. 3 is a cross-sectional view through a single switch device and the connecting terminals for a circuitboard member utilizing the schematic circuit depicted in FIG. 2.

FIG. 3 shows an enlarged cross-section of a typical switch device which can be employed in the above described lamp firing circuit. More particularly, a switch terminal pair 14 and 15 are mounted on circuitboard member 16. Said radiation switch 17 is applied to the circuitboard 16 as a coating in electrical contact with the terminals 13 and 14. Accordingly, each radiation switch upon receiving heat and/or light radiation from the adjacent lamp when it is flashed, changes from an open circuit of high resistance to a closed circuit of low resistance, thereby electrically connecting the switch terminals embedded therein so as to enable flashing of the next lamp in the sequence.

The present invention resides in the discovery that a suitable material for preparing said radiation switches has the above defined switch material composition in order to convert when exposed to the heat radiated from the lamp to a low electrical resistance in the approximate range 0.03-0.3 ohms and which does not convert spuriously or with such vigorous action to produce a discontinuity in the associated electrical circuit. Accordingly, it is required that no "blow-off" of the switch device takes place during its thermochemical conversion and that the converted mass of silver metal remains adhesively bonded to the support member for the electrical circuit. An especially preferred switch material composition exhibiting all the foregoing desired characteristics comprises in weight percent 61% silver oxide, 28% copper powder, 5% ethyl hydroxyethyl cellulose, 6% black phenolic resin, and 0.5% conversion inhibitor. For added humidity resistance of the deposit switch device, it is also preferred to rinse the silver oxide used in said switch material with a liquid solution of the selected conversion inhibitor.

It will be apparent from the foregoing description that various modifications may be made in the above disclosed photoflash unit embodiments without departing from the true spirit and scope of the invention. For example it is not essential that the switch devices be deposited directly on the printed circuitboard or operated only in conjunction with the number or type of flashlamps specifically disclosed. It is intended to limit the present invention, therefore, only by the scope of the following claims.

What we claim as new and desire to secure by United States Letters Patent is:

1. A photoflash lamp unit comprising:
   (a) a pair of low voltage type flashlamps,
   (b) an electrical circuit into which said lamps are arranged to fire individually and in sequence, and
   (c) a solid state radiant energy switching device located external of the lamps and forming part of the electrical circuit, said switching device being located adjacent one of said lamps and disposed to receive radiant energy emitted by that lamp, said photoflash unit being characterized by said flashlamps being actuated by a low voltage firing pulse and by said switching device comprising a particulate mixture in weight percent approximately 51-72% silver oxide, approximately 20-36% powdered metal exhibiting thermal and electrical conductivity which does not react exothermally with said silver oxide and further including approximately 8-13% high relative humidity resistant organic polymer binder mixture, said mixture having one organic polymer serving as a fuel during conversion of the silver oxide along with another organic polymer binder more resistant to combustion and serving to provide adhesive bonding action after said conversion takes place.

2. The photoflash unit of claim 1 wherein said metal is powdered copper.

3. The photoflash unit of claim 1 wherein said metal is powdered aluminum.

4. The photoflash unit of claim 1 wherein sufficient metal is present in the switch mixture to decrease the electrical resistivity after the switch has been converted to no greater than about 0.3 ohms.

5. The photoflash unit of claim 1 wherein said switching device extends between and contacts a pair of terminals in said electrical circuit.

6. The photoflash unit of claim 1 wherein said flashlamps each comprise a hermetically sealed transparent envelope containing ignition means, a combustion supporting atmosphere at above atmospheric pressure, and filamentary combustible material.

7. The photoflash unit of claim 6 wherein said ignition means comprises a pair of lead-in conductors connected to a resistance filament coated with a primer material.

* * * * *